United States Patent
Peeler et al.

(10) Patent No.: US 10,148,241 B1
(45) Date of Patent: Dec. 4, 2018

(54) ADAPTIVE AUDIO INTERFACE

(71) Applicant: Dell Products, L.P., Round Rock, TX (US)

(72) Inventors: Doug Jarrett Peeler, Austin, TX (US); Ray Vivian Kacelenga, Austin, TX (US); Nitin B. Gupte, Beaverton, OR (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/818,498

(22) Filed: Nov. 20, 2017

(51) Int. Cl.
*H03G 3/32* (2006.01)
*H04R 3/00* (2006.01)
*H04R 29/00* (2006.01)

(52) U.S. Cl.
CPC ............... *H03G 3/32* (2013.01); *H04R 3/00* (2013.01); *H04R 29/001* (2013.01)

(58) Field of Classification Search
CPC ...... H04S 7/303; H04S 7/302; H04S 2400/13; H03G 3/32
See application file for complete search history.

(56) References Cited

U.S. PATENT DOCUMENTS

| | | | | |
|---|---|---|---|---|
| 6,349,225 B1* | 2/2002 | Lands | ............... | H04M 1/0243 455/569.1 |
| 8,488,799 B2* | 7/2013 | Goldstein | ............... | G10L 19/00 381/122 |
| 9,159,312 B1* | 10/2015 | Tom | ............... | G10K 11/175 |
| 9,398,392 B2* | 7/2016 | Ridihalgh | ............... | H04S 7/301 |
| 9,692,380 B2* | 6/2017 | Herman | ............... | H03G 3/3005 |
| 2002/0086656 A1* | 7/2002 | Mattisson | ............... | H04M 1/6016 455/355 |
| 2006/0093161 A1* | 5/2006 | Falcon | ............... | H03G 3/3026 381/104 |
| 2006/0165242 A1* | 7/2006 | Miki | ............... | H04R 3/005 381/59 |
| 2007/0025555 A1* | 2/2007 | Gonai | ............... | H04R 5/04 381/17 |
| 2010/0135502 A1* | 6/2010 | Keady | ............... | A61B 5/121 381/58 |
| 2010/0142725 A1* | 6/2010 | Goldstein | ............... | H04R 29/00 381/92 |
| 2010/0167800 A1* | 7/2010 | Wakizaka | ............... | H04M 1/605 455/575.1 |
| 2011/0103617 A1* | 5/2011 | Shin | ............... | H03G 3/32 381/107 |
| 2011/0137649 A1* | 6/2011 | Rasmussen | ............... | H04R 25/356 704/231 |

(Continued)

*Primary Examiner* — Mohammad Islam
(74) *Attorney, Agent, or Firm* — Fogarty LLP

(57) ABSTRACT

Systems and methods for an adaptive audio interface. In an illustrative, non-limiting embodiment, an Information Handling System (IHS) may include a processor and a memory coupled to the processor, the memory including program instructions stored thereon that, upon execution by the processor, cause the IHS to: classify an audio environment; adjust an audio output gain setting based upon the classification; as a user changes position with respect to the IHS, monitor a distance between the user and the IHS; and modify the adjusted audio output gain setting based upon the monitoring, such that the modification causes a constant sound pressure level to be maintained at the user's position.

11 Claims, 6 Drawing Sheets

(56) References Cited

U.S. PATENT DOCUMENTS

| | | | |
|---|---|---|---|
| 2011/0305346 A1* | 12/2011 | Daubigny | H03G 3/32 381/28 |
| 2012/0020487 A1* | 1/2012 | Fried | H03G 3/301 381/58 |
| 2012/0154632 A1* | 6/2012 | Ota | G10L 21/028 348/231.4 |
| 2013/0094668 A1* | 4/2013 | Poulsen | H03G 3/301 381/107 |
| 2013/0202132 A1* | 8/2013 | Zurek | H04M 1/605 381/107 |
| 2013/0294618 A1* | 11/2013 | Lyubachev | H04S 7/303 381/80 |
| 2014/0112483 A1* | 4/2014 | Etter | H03G 3/3005 381/56 |
| 2014/0179380 A1* | 6/2014 | Roh | H04M 1/0268 455/569.1 |
| 2015/0003652 A1* | 1/2015 | Bisgaard | H04R 25/50 381/314 |
| 2015/0010169 A1* | 1/2015 | Popova | H04S 7/303 381/107 |
| 2016/0165374 A1* | 6/2016 | Shi | H04S 5/005 381/303 |
| 2016/0330396 A1* | 11/2016 | Garcia Navarro | G10L 21/10 |
| 2016/0366531 A1* | 12/2016 | Popova | H04S 7/303 |
| 2017/0092288 A1* | 3/2017 | Dewasurendra | G10L 21/0208 |
| 2017/0188171 A1* | 6/2017 | Ishida | H04S 7/303 |
| 2018/0068670 A1* | 3/2018 | Lu | G10L 17/06 |
| 2018/0074782 A1* | 3/2018 | McGibney | G06F 3/165 |

* cited by examiner

400

```
//Learning Phase
N = 5;                                              // # of Learning events
Gain = user set gain;
if Event = 0                                        // first event
{
    X(t-1) = 0; X(t-2) = 0; X(t-3) = 0; X(t-4) = 0; // initialize filter memory to zero
    X(t) = Input_sample;                            // first Gain value
}
For Event = 1to N-1                                 // subsequent learning phase events
{
        X(t-4) = X(t-3);
        X(t-3) = X(t-2);
        X(t-2) = X(t-1);
        X(t-1) = X(t);
        X(t) = Input_sample;
}
```
$$Y(t) = \frac{1}{N}[X(t) + X(t-1)+X(t-2)+X(t-3)+X(t-4)];$$ // run smoothing filter
```
Gain = Y(t);                                        // learned Gain
// Adaptation Phase
if Event >N                                         // apply learned gain parameters
{
    if new Input_sample                             // if user overrides computed values
    {
        X(t-4) = X(t-3);
        X(t-3) = X(t-2);
        X(t-2) = X(t-1);
        X(t-1) = X(t);
        X(t) = Input_sample;
```
$$Y(t) = \frac{1}{N}[X(t) + X(t-1)+X(t-2)+X(t-3)+X(t-4)];$$ //run smoothing fliter
```
        Gain = Y(t);
    }
    else
        Do nothing;
}
```

FIG. 4

ADAPTIVE AUDIO INTERFACE

FIELD

The present disclosure generally relates to Information Handling Systems (IHSs), and, more particularly, to systems and methods for an adaptive audio interface.

BACKGROUND

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

As the inventors hereof have recognized, our modern-day mobile workforce conducts business in a multitude of environments. No longer are we limited to quiet office spaces and conference rooms. In order to remain competitive in today's commercial environment, users are finding they need to be able to conduct business whenever and wherever they are.

Moreover, a large part of today's business is conducted via online communications platforms. Headsets and ear buds have become as ubiquitous as the host platforms they connect to, enabling users to remain in contact with teammates or business partners whether they are at work, at home, or commuting. Yet, all of these environments present different ambient audio interference levels that can degrade the user experience.

For example, when commuting by train, bus, or car, traffic and passenger noise often makes it difficult to hear incoming audio communications causing the user to manually raise their headset or earbuds' volume. When driving, manually adjusting the volume can create untenable hazardous conditions. As another example, aircraft engine noise at airports and in the air create a particularly difficult and often aggravating audio environment for passengers on voice calls or consuming streaming music or video media.

While noise-cancelling headsets can help mitigate noise, users still find themselves periodically adjusting their device's audio settings. Also, high ambient noise typically causes the user to raise their voice when speaking into the microphone in a bid to swamp the background noise. Soft-spoken users generally find it stressful and unsatisfying to "yell" into the microphone when taking calls in a public place, for instance.

As the inventors hereof have also recognized, conventional attempts to address the aforementioned issues have not been specifically tailored for individual users, and therefore still generally result in the user often having to make gross, manual audio adjustments. Accordingly, to address these and other problems, the inventors hereof have developed systems and methods for an adaptive audio interface.

SUMMARY

Embodiments of systems and methods for an adaptive audio interface. In an illustrative, non-limiting embodiment, an Information Handling System (IHS) may include a processor and a memory coupled to the processor, the memory including program instructions stored thereon that, upon execution by the processor, cause the IHS to: classify an audio environment; adjust an audio output gain setting based upon the classification; as a user changes position with respect to the IHS, monitor a distance between the user and the IHS; and modify the adjusted audio output gain setting based upon the monitoring, such that the modification causes a constant sound pressure level to be maintained at the user's position. For example, the audio environment may be selected from the group consisting of: quiet, noisy, mechanical noise, speech, music, motion, and engine.

In some cases, to adjust the audio output gain setting, the program instructions, upon execution, may cause the IHS to: retrieve a stored audio output gain setting indicative of a previous selection by the user in the audio environment; and apply the stored audio output gain setting to an audio output. And, to retrieve the stored audio output gain setting, the program instructions, upon execution, may cause the IHS to: calculate the stored audio output gain setting based upon a running average of a plurality of audio output gain settings previously selected by the user in the audio environment.

In various implementations, to calculate the stored audio output gain setting, the program instructions, upon execution, may cause the IHS to apply an exponentially weighed smoothing filter to the plurality of audio output gain settings. For instance, the IHS may identify an ongoing IHS operation selected from the group consisting of: video playback, music playback, or call.

In response to an ongoing IHS operation being identified as being and/or including a two-way voice communication, the program instructions, upon execution, may cause the IHS to: adjust an audio input gain setting based upon the classification; and modify the adjusted audio input gain setting based upon the monitoring, such that the modification compensates for the distance.

In another illustrative, non-limiting embodiment, a method may implement one or more of the aforementioned operations. In yet another illustrative, non-limiting embodiment, a hardware memory device may have program instructions stored thereon that, upon execution by an IHS, cause the IHS to perform one or more of the aforementioned operations.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

FIG. 4 is an example of program instructions configured to implement gain adaptation techniques according to some embodiments.

DETAILED DESCRIPTION

Systems and methods described herein may provide an adaptive audio interface. In some embodiments, these systems and methods may enable the implementation of automated and adaptive gain adjustment techniques based on the nature and level of ambient noise and a user's personal, custom, or preferred audio settings. Additionally or alternatively, in order to free the user from constant manual adjustments of the microphone and/or speaker levels when operating at different distances from the platform, these systems and methods may provide techniques for measuring the user's distance from the platform, and then using that information to improve the user's audio experience by maintaining a constant SPL at the user's location in the space.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below.

Figure 1:
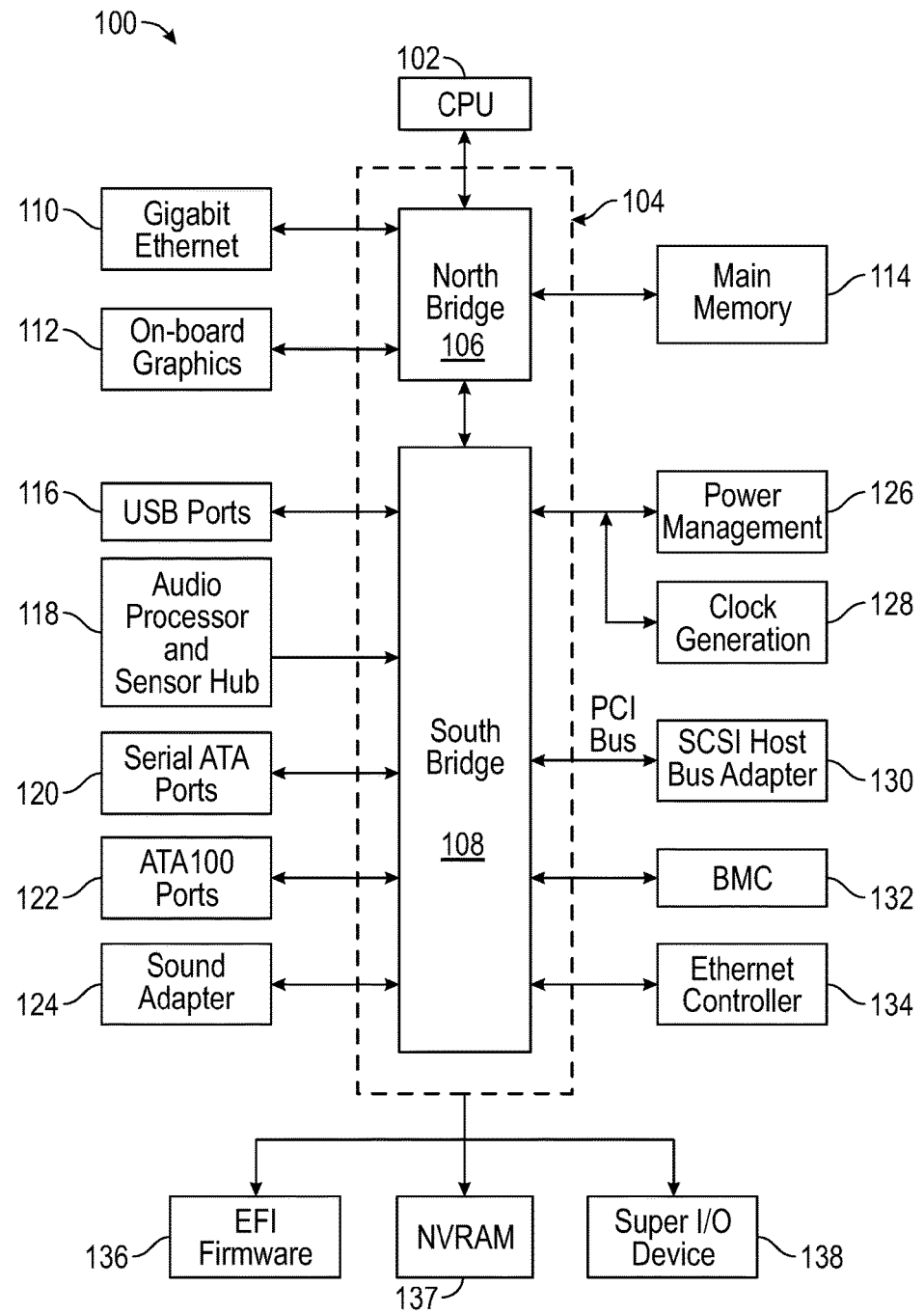
FIG. 1 illustrates an example of an Information Handling System (IHS) implementation according to some embodiments.

FIG. 1 shows an example of an IHS configured to implement the systems and methods described herein. It should be appreciated that although certain embodiments described herein may be discussed in the context of a desktop or server computer, other embodiments may be utilized with virtually any type of IHS. In this example, the IHS is configured to facilitate establishing CRTM for BIOS recovery images.

Particularly, the IHS includes a baseboard or motherboard, which is a printed circuit board (PCB) to which components or devices are mounted to by way of a bus or other electrical communication path. For example, Central Processing Unit (CPU) 102 operates in conjunction with a chipset 104. CPU 102 is a processor that performs arithmetic and logic necessary for the operation of the IHS.

Chipset 104 includes northbridge 106 and southbridge 108. Northbridge 106 provides an interface between CPU 102 and the remainder of the IHS. Northbridge 106 also provides an interface to a random access memory (RAM) used as main memory 114 in the IHS and, possibly, to on-board graphics adapter 112. Northbridge 106 may also be configured to provide networking operations through Ethernet adapter 110. Ethernet adapter 110 is capable of connecting the IHS to another IHS (e.g., a remotely located IHS) via a network. Connections which may be made by network adapter 110 may include local area network (LAN) or wide area network (WAN) connections. Northbridge 106 is also coupled to southbridge 108.

Southbridge 108 is responsible for controlling many of the input/output (I/O) operations of the IHS. In particular, southbridge 108 may provide one or more universal serial bus (USB) ports 116, sound adapter 124, and Ethernet controller 134.

In various implementations, IHS 100 may include audio processor and sensor hub 118 coupled to IHS 100 via southbridge 108, or any other suitable communication or bus mechanism. Examples of audio processor and sensor hub 118 include processors, controllers, Digital Signal Processors (DSPs), System-On-Chip (SOCs) platforms, or the like.

In some cases, audio processor and sensor hub 118 may include a low-power audio engine with multiple "always-on" capabilities that include wake-on-voice, keyword detection, and speaker ID, among others. A Discrete Sensor Hub (DSH) and/or an Integrated Sensor Hub (ISH) may be used, and a proximity sensor (optical, infrared, or ultrasonic sensors, etc.) may be coupled to the DSH or ISH via an $I^2C$ interface or the like.

When IHS 100 is operating in a particular audio use-case (e.g., voice call, video playback, and music playback) proximity data may be processed by audio processor and sensor hub 118 and communicated to an audio DSP either directly via InterProcess Communications (IPC), if using the ISH, or via processor 101 if using DSH.

The information obtained by audio processor and sensor hub 118 may include whether the user is present, and the distance between the user and the IHS platform or system. In some cases, an active Time-of-Flight (TOF) proximity sensor may be used. For example, an energy-efficient TOF sensor may include a low-power, non-imaging sensor, that does not degrade the user experience and/or does not deplete the battery. The system resolves distance based on the known speed of light, measuring the time-of-flight of a light signal between the sensor and the subject. As such, the system may be used, for example, to determine whether a user is within a prescribed distance (e.g., up to ~1.5 to 2.0 m) from the platform. The round trip time-of-flight of the emitted IR pulse may be used to determine the distance of the user from the sensor location or platform.

Southbridge 108 may also provide a bus for interfacing peripheral card devices such as BIOS boot system-compliant SCSI host bus adapter 130. In some embodiments, the bus may include a peripheral component interconnect (PCI) bus. Southbridge 108 may also provide baseboard management controller (BMC) 132 for use in managing the various components of the IHS. Power management circuitry 126 and clock generation circuitry 128 may also be utilized during operation of southbridge 108.

Additionally, southbridge 108 is configured to provide one or more interfaces for connecting mass storage devices to the IHS. For instance, in an embodiment, southbridge 108 may include a serial advanced technology attachment (SATA) adapter for providing one or more serial ATA ports 120 and/or an ATA100 adapter for providing one or more ATA100 ports 122. Serial ATA ports 120 and ATA100 ports 122 may be, in turn, connected to one or more mass storage devices storing an operating system (OS) and application programs.

An OS may comprise a set of programs that controls operations of the IHS and allocation of resources. An application program is software that runs on top of the OS and uses computer resources made available through the OS to perform application-specific tasks desired by the user.

Mass storage devices connected to southbridge 108 and SCSI host bus adapter 130, and their associated computer-readable media provide non-volatile storage for the IHS. Although the description of computer-readable media contained herein refers to a mass storage device, such as a hard disk or CD-ROM drive, it should be appreciated a person of ordinary skill in the art that computer-readable media can be any available media on any memory storage device that can be accessed by the IHS. Examples of memory storage devices include, but are not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices.

A low pin count (LPC) interface may also be provided by southbridge 108 for connecting Super I/O device 138. Super I/O device 138 is responsible for providing a number of I/O ports, including a keyboard port, a mouse port, a serial interface, a parallel port, and other types of input/output ports.

The LPC interface may connect a computer storage media such as a ROM or a flash memory such as a non-volatile random access memory (NVRAM) for storing BIOS/firmware 136 that includes BIOS program code containing the basic routines that help to start up the IHS and to transfer information between elements within the IHS. BIOS/firmware 136 comprises firmware compatible with the Extensible Firmware Interface (EFI) Specification and Framework.

The LPC interface may also be utilized to connect NVRAM 137 to the IHS. NVRAM 137 may be utilized by BIOS/firmware 136 to store configuration data for the IHS. In other embodiments, configuration data for the IHS may be stored on the same NVRAM 137 as BIOS/firmware 136.

BMC 132 may include non-volatile memory having program instructions stored thereon that enable remote management of the IHS. For example, BMC 132 may enable a user to discover, configure, and manage the IHS, setup configuration options, resolve and administer hardware or software problems, etc. Additionally or alternatively, BMC 132 may include one or more firmware volumes, each volume having one or more firmware files used by the BIOS' firmware interface to initialize and test components of the IHS.

As a non-limiting example of BMC 132, the integrated DELL Remote Access Controller (iDRAC) from DELL, INC. is embedded within DELL POWEREDGE servers and provides functionality that helps information technology (IT) administrators deploy, update, monitor, and maintain servers with no need for any additional software to be installed. The iDRAC works regardless of OS or hypervisor presence from a pre-OS or bare-metal state, because iDRAC is embedded within the IHS from the factory.

It should be appreciated that, in other embodiments, the IHS may comprise other types of computing devices, including hand-held computers, embedded computer systems, personal digital assistants, and other types of computing devices. It is also contemplated that the IHS may not include all of the components shown in FIG. 1, may include other components that are not explicitly shown in FIG. 1, or may utilize a different architecture.

Figure 2:
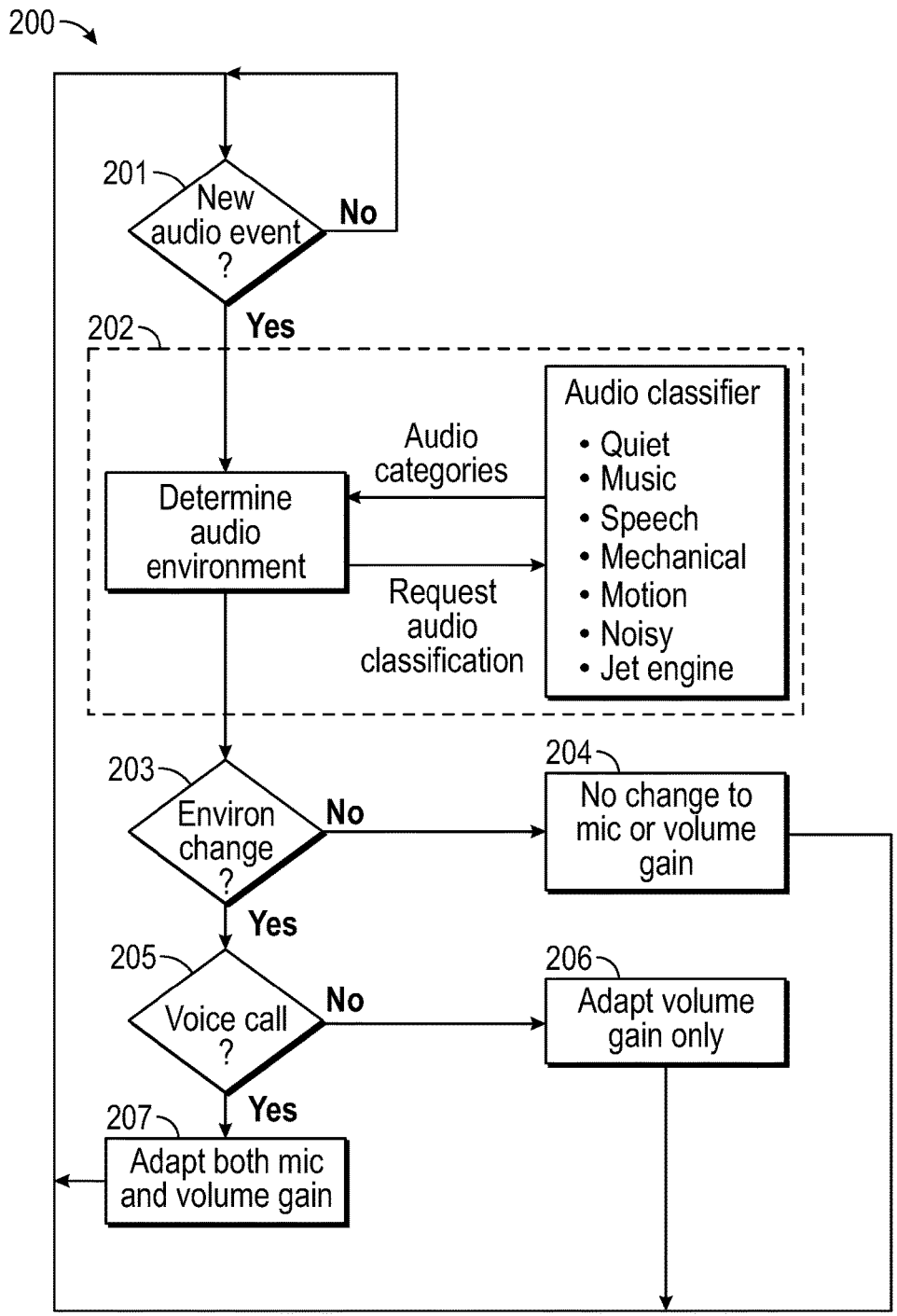
FIG. 2 illustrates an example of a method for setting one or more class-based, adaptive audio gain parameters according to some embodiments.

FIG. 2 illustrates an example of method 200 for setting one or more class-based, adaptive audio gain parameters according to some embodiments. At block 201, method 200 may identify an ongoing IHS operation such as: video playback, music playback, or call. In some cases, triggering method 200 by detecting the operation of a particular "use case" or "audio class," using block 201, can avoid sampling the ambient audio environment unnecessarily. At block 202, method 200 detects an audio environment using an audio classifier or the like: method 200 requests audio classification of ambient noise and receives a corresponding one of a plurality of possible classifications.

At block 203, if the environment has not changed (e.g., compared to the previous classification), block 204 maintains the current audio input and audio output gain parameters. At block 205, if method 500 identifies the audio event as not being a voice call (e.g., music or video playback), block 206 adapts the audio output gain only (i.e., volume). If, however, block 205 determines the audio event as being a voice call, block 207 adapts both the audio input and audio output gain parameters. Changes to these parameters may be applied in response to the audio classification and/or to user preferences, as described in more detail below.

Moreover, audio processor and sensor hub 118 may have the ability to "listen" to the user's ambient audio environment and to classify it into one of several predetermined categories along with a likelihood ratio from which a level of confidence can be derived.

Table I below lists examples of ambient audio categories or classifier outputs. Some of these categories may have sub-categories such as Speech-male, Speech-female, or Music-rock and Music-classical. Additional categories (e.g., "engine and airport noise), may be created whenever corresponding audio data is available for training Gaussian Mixture Models or other suitable audio classifiers.

TABLE I

|   | Audio Category | $SPL_{dB}$ Example |
|---|---|---|
| 1 | Quiet | 20-30 |
| 2 | Noisy | 60-70 |
| 3 | Mechanical noise | 90-110 |
| 4 | Speech | 40-60 |
| 5 | Music | 75-120 |
| 6 | Motion - rustling | 10-15 |
| 7 | Jet Engine - Airports (OEMs to request) | 110-140 |

A useful piece of information that is available from the audio classifier is the Sound Pressure Level (SPL) (e.g., in dB) that may be used in making gain adjustment decisions. In some cases, the user's physical location (e.g., determined by a Global Positioning System or GPS coupled to the IHS) may be used by the classifier to confirm or distinguish between the classification. For instance, if the user is not near an airport, the same ambient SPL level (e.g., ~110 dB) may be classified as "mechanical noise" instead of "jet engine," for example. Similarly, if the user is physically present a music venue during concert, the same ambient SPL level (e.g., ~120 dB) may be classified as "music" or "concert," instead of "jet engine." In some cases, both location and time information may be used to determine or help confirm the user's environment, in addition to the ambient audio and use case analysis. These distinctions may help set a different gain parameters, depending upon the spectral content of the ambient sound, in addition to its overall SPL.

Still referring to FIG. 2, when one of pre-determined audio use cases occurs, the ambient audio environment may be sampled to determine the ambient SPL and the corresponding audio class or category. The audio gain, volume and/or microphone, are computed only when the environment changes from the prevailing or initial one. For example, if the user is in a video conference call meeting in the cafeteria, volume and microphone gain pair parameters may be set at levels A and B, respectively, calculated as a function of both SPL and audio class. If, after the video conferencing session, the user receives or makes a voice call while still in the cafeteria, the previously computed gain parameters A and B are retained. On the other hand, if the user makes the call from a quiet office or conference room, gain parameters may be adjusted to match the new quiet environment.

In contrast, in method 200, cases of non-voice activated music or video playback do not require the calculation of the microphone gain. In these use cases, only the speaker volume is automatically adjusted to match the new ambient audio environment.

Table II calls out applicable parameters to be computed for each use case:

TABLE II

| Use Case | Speaker Volume (X gain) | Microphone Gain (Y gain) |
|---|---|---|
| Music Playback | Yes | No |
| Video Playback | Yes | No |
| Voice Calls | Yes | Yes |

In some cases, gain levels may be calculated as a function of SPL and the ambient audio environment, and generalized to all users. In other cases, however, an adaptive techniques that learns the user's gain settings over time and automatically applies them on behalf of the user may be used.

That is, in various embodiments, rather than using fixed gain values A and B for each audio category, systems and methods described herein may allow a user's system to automatically learn the audio gain settings that the user typically uses in each one of a plurality of predetermined audio environment classifications. In some cases, the systems and methods may calculate the stored audio output gain settings by applying an exponentially weighed smoothing filter to the plurality of audio output gain settings.

Figure 3A:
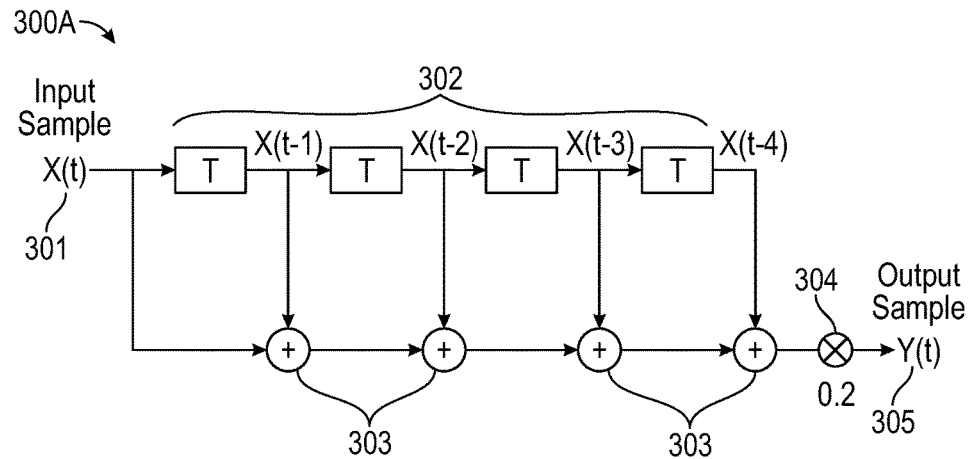
FIGS. 3A and 3B are examples of smoothing filters for gain values according to some embodiments.
Figure 3B:
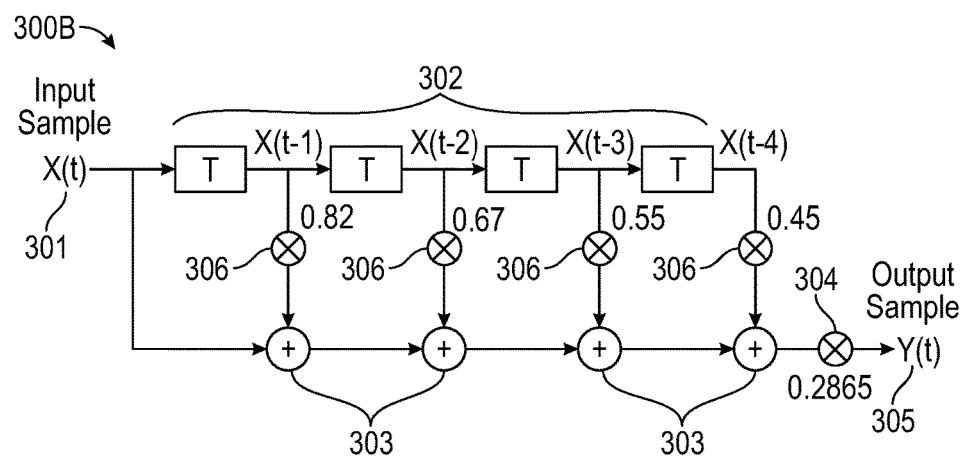

FIGS. 3A and 3B are examples of smoothing filters usable during a training phase (and thereafter) for setting audio input and/or output gain values. In some embodiments, during a learning phase, audio processor and sensor hub 118 captures and tracks audio settings of the user each time the user operates in a particular environment. For example, the user may operate in a noisy environment in the morning at 9:00 AM. The user's audio input and/or output settings may be denoted as X(t). If the user again operates in a noisy environment at 3:00 PM, the previously captured settings X(t) are now be labeled as X(t−1) and the new settings are denoted as X(t). A third time in the same noisy environment results in X(t−2)=X(t−1), X(t−1)=X(t), and X(t)=input sample.

FIGS. 3A and 3B are examples of smoothing filters for gain values according to some embodiments. In FIG. 3A, input sample 301 is filtered through section 302, as noted above, and the cumulative value 303 produces output sample 305 upon application of factor 304. In FIG. 3B, each of sections 302 receives different individual, exponentially decreasing weight 306. In each case, an audio output or input gain setting may be selected upon a running average of a plurality of audio output and input gain settings previously selected by the user in that audio environment.

In the foregoing, non-limiting examples, 300A represents a Finite Impulse Response (FIR) filter that can be used to capture a user's gain settings over a period of five events in the same audio environment. Here, T represents a single memory location for storing one gain value. The output Y(t) is computed according to equation 1 which calculates a running average of the user's last four settings and the current setting. In this example, the learning phase spans N=5 events, but this can be shortened or lengthened as needed.

Once the learning phase is completed, the system subsequently uses the learned value Y(t), each time the user operates in the respective environment, to automatically set the gain for the user. If, at some point in the future, the user changes the gain settings, the same smoothing algorithm is used to update the output Y(t) as a result of the new input. Since there are seven audio classes in Table 1, Equation I below is replicated a total of 14 times, two for each class (volume and microphone gains A and B, for instance).

In system 300A, the follow equation applies:

$$Y(t) = \frac{1}{N}[X(t) + X(t-1) + X(t-2) + X(t-3) + X(t-4)] \quad \text{Equation (1)}$$

While the five samples in Equation 1 are equally weighted, older samples can be deemphasized, if desired, by applying a suitably designed weighting function such as a 5-point decaying exponential $e^{-\lambda x}$ for x=0, 1, 2, 3, 4. Large values for a decay constant $\lambda$ cause a rapid de-emphasis while smaller values retain more of the past memory. For example, a decay value of $\lambda=\frac{1}{5}$ yields the smoothing filter shown in FIG. 3B.

To illustrate further, FIG. 4 is an example of program instructions 400 configured to implement gain adaptation techniques. In various embodiments, instructions 400 may be used for automatically adapting the audio volume and microphone gain based on the ambient audio categories provided by the ambient audio classifier. Instructions 400 are split into two portions, the learning phase and the adaptation or active phase.

The learning phase initializes the smoothing and tracking filter when the first event occurs and populates the filter memory during the remaining learning phase events. During this phase the user freely adjust the volume and microphone gain to levels that match the environment they are in. After the 5$^{th}$ event in the same audio environment, the smoothing filter runs and generates a representative gain value for subsequent automatic application during the adaptation phase.

During the adaptation phase, audio gain parameters observed during the learning phase are actively employed to relieve the user from having to manually tune the audio experience. In the event that the user manually adjusts these parameters during this phase, the filter tracks the new inputs and computes a new set of gain parameters for subsequent use.

As such, program instructions 400 may be used to track and adapt to individual user preferred gain settings, automatically apply user preferences in various audio environments with no user involvement, and/or continuously track any user audio gain input settings and updates the gain parameters In some cases, an Original Equipment Manufacturer (OEM) may develop their own compact code, and load it into the audio engine using a vendor's Firmware Development Kit (FDK).

Whether or not a user is wearing a headset, or relying on the IHS's internal microphone and/or speakers for voice calls, video, or music playback use cases, the adaptive strategies described above work well when the user is at the same fixed distance from the IHS. In many scenarios, however, the user's distance from the IHS can vary appreciably.

This disclosure augments the adaptive strategy described earlier by actively monitoring the user's distance from the platform whenever the user is not using headphones or earphones, and when one of the three use cases (i.e., voice calls, video playback, and music playback) is active. The distance information may then be used to compensate for the decrease in Sound Pressure Level (SPL) as the user moves back and forth in front of the platform microphone(s) and speakers The audio classifier may be executed each time one of the use cases (voice call, video playback, and music playback) is active and measures the SPL at the platform location. Once the SPL value is known, the Inverse Distance Law (i.e., p=1/r) may be used to track the SPL changes as the user moves back and forth in front of the platform. The SPL deltas are used to determine how to adjust the gain in order to raise or lower the SPL at the new user's location to the level that was initially detected at the platform location.

Figure 5A:
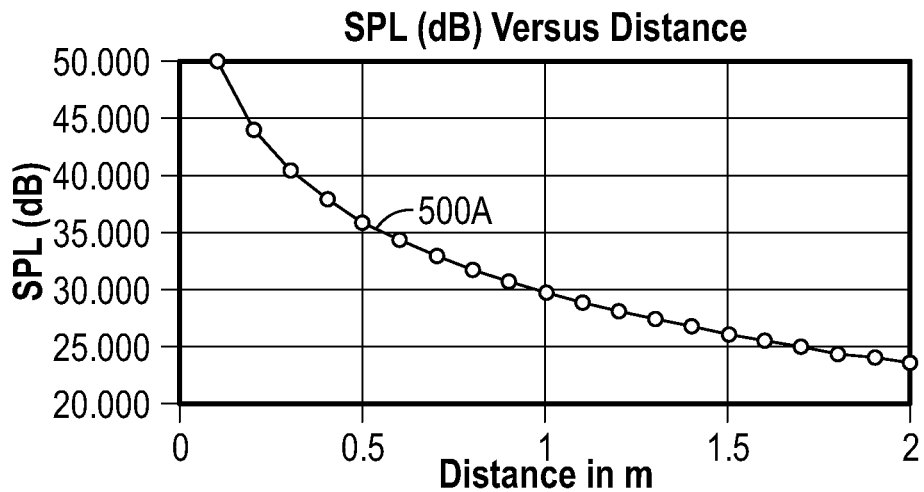
FIGS. 5A and 5B are examples of propagation spreading and sound pressure level (SPL) compensation according to some embodiments.
Figure 5B:
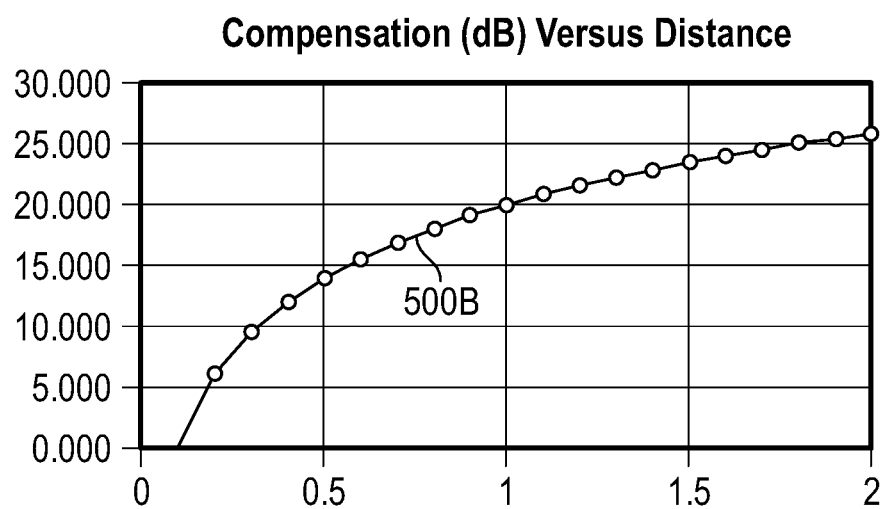

In that regard, FIGS. 5A and 5B are examples of propagation spreading and sound pressure level (SPL) compensation according to some embodiments. Graph 500A shows that the SPL of a spherical wave front emitted from a point source is inversely proportional to the distance from the point source i.e. p=1/r, where p is the SPL and r is the distance from the point emitter source. For example, if the $SPL_{dB}$ at a distance r is known (35 dB, say), then the $SPL_{dB}$ at a distance 2r will be 20 log(½)=−6.02 dB lower than that at r (i.e. 35−6.02=28.98 dB).

The inverse relationship between $SPL_{dB}$ and distance may be used to automatically adjust the audio gain so that the user perceives a constant SPL when in front of the platform up to a range of ~1.5 to 2.0 m. It is also noted that there is a significant decrease in SPL over the relatively short working distance of 2 m.

Graph 500B shows a plot of the required level of SPL compensation as a function of distance to maintain a constant SPL at different locations or distances from the IHS. At any user location within the range of the proximity sensor (~2 m), the sum of the values in graphs 5A and 5B is constant (50 dB, in this example). Two parameters may be used to kick off the equalization process: (1) SPL in the immediate vicinity of the platform, and (2) the distance of the user from the platform.

Figure 6:
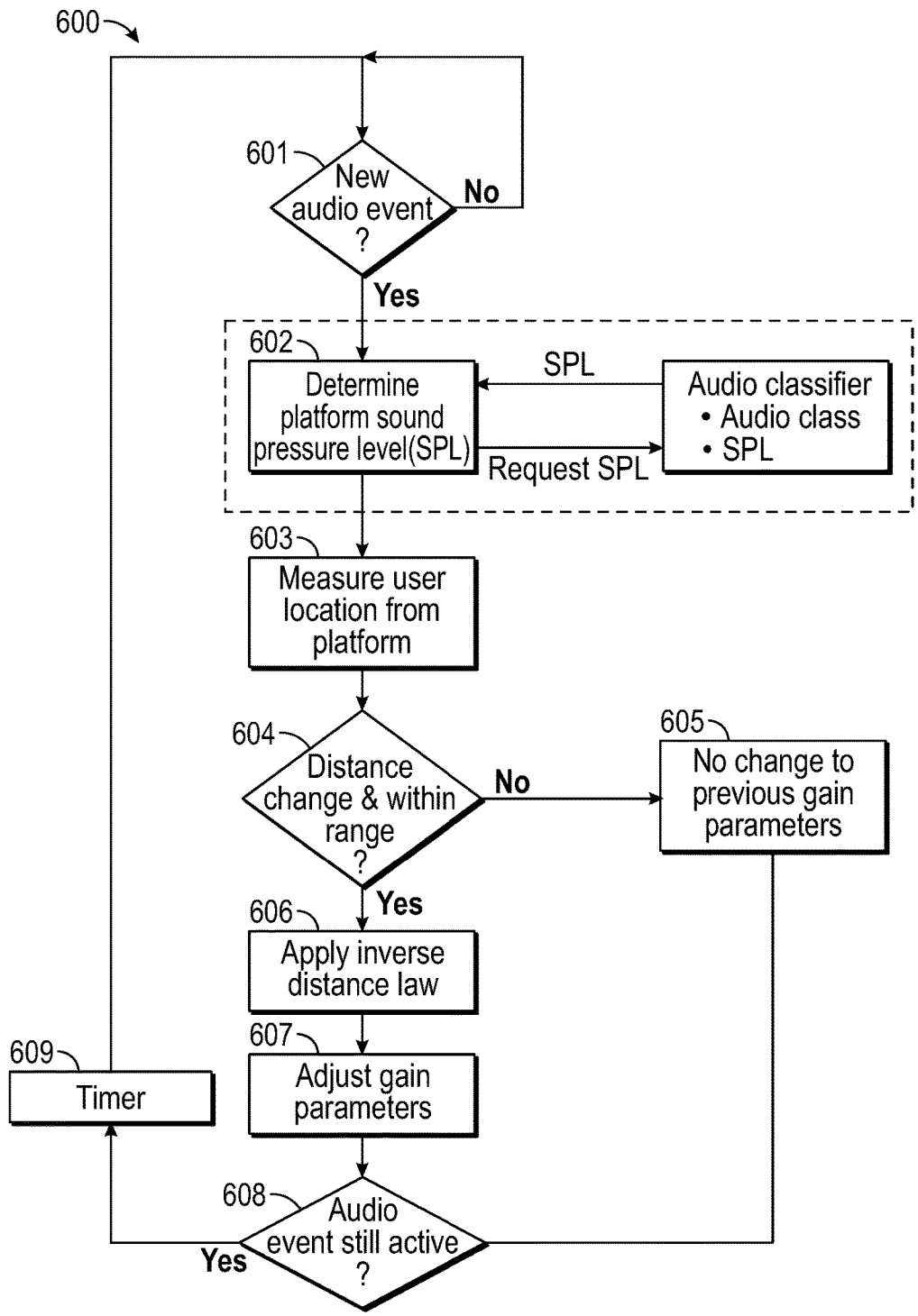
FIG. 6 illustrates an example of a method for SPL equalization using proximity and an audio classifier according to some embodiments.

FIG. 6 illustrates an example of method 600 for SPL equalization using proximity and an audio classifier according to some embodiments. Generally, method 600 may adjust an audio output gain setting using a classification technique described above, and then, as a user changes positions with respect to the IHS, method 600 may monitor a distance between the user and the IHS, and it may modify the adjusted audio output gain setting based upon the monitoring. The modification causes a constant sound pressure level to be maintained at the user's new or changing position.

At block 601, method 600 determines whether there is a new audio event. If so, block 602 determines the SPL that the IHS or user are subject to during the audio event. Block 603 measures the user's location from the IHS, for example, using a TOF proximity sensor or the like. At block 604, if the distance change is within a selected range (e.g., to add hysteresis), block 605 maintains the current gain settings or parameters. If the distance change is beyond the minimum range, block 606 applies an inverse distance law. Block 607 adjusts the gain parameters based upon that modification.

At block 608, if the audio event is no longer active, control returns directly to block 601. Conversely, if the same audio event is still active, timer 609 adds a selected time interval to method 600 prior to returning control to block 601.

In other words, method 600 illustrates the flow of events after the user's preferred gain settings have already been automatically applied. The TOF proximity sensor determines whether the user is present or absent and also determines how far from the platform the user is. The SPL compensation required is determined using the Inverse Distance Law, and the audio gain parameters are adjusted to assert the platform SPL at the user's location.

A closed-loop SPL control strategy that involves the audio classifier, the distance measurement, and the audio gain adjustment functions is employed. That is, the audio classifier initially generates the SPL at the platform. The sensor then determines the distance of the user from the platform which is used to determine the delta in SPL. The delta SPL information is used by the audio gain function to alter the gain so that the SPL at the user's location is equal to what it would be if the user were at the nominal position in front of the platform.

As such, systems and methods described herein may promote maintenance of a constant SPL within the distance range supported by the sensor. These systems and methods may periodically track changes in user location with no active user input, and can be scaled to longer distances, as determined by suitable sensors.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a processor; and
a memory coupled to the processor, the memory having program instructions stored thereon that, upon execution, cause the IHS to:
classify an audio environment;
calculate an audio output gain setting based upon a running average of a plurality of audio output gain settings previously selected by a user in the audio environment, at least in part, by applying an exponentially weighed smoothing filter to the plurality of audio output gain settings;
apply the calculated audio output gain setting to an audio output;
as a user changes position with respect to the IHS, monitor a distance between the user and the IHS;
modify the calculated audio output gain setting based upon the monitoring, wherein the modification causes a constant sound pressure level to be maintained at the user's position; and
apply the modified audio output gain setting to the audio output.

2. The IHS of claim 1, wherein the audio environment is selected from the group consisting of: quiet, noisy, mechanical noise, speech, music, motion, and engine.

3. The IHS of claim 1, wherein the program instructions, upon execution, further cause the IHS to identify an ongoing IHS operation selected from the group consisting of: video playback, music playback, or call.

4. The IHS of claim 3, wherein the ongoing IHS operation is the call, and wherein the program instructions, upon execution, further cause the IHS to:
adjust an audio input gain setting based upon the classification; and
modify the adjusted audio input gain setting based upon the monitoring, wherein the modification compensates for the distance.

5. A hardware memory device having program instructions stored thereon that, upon execution by an Information Handling System (IHS), cause the IHS to:
classify an audio environment;
calculate an audio output gain setting based upon a running average of a plurality of audio output gain settings previously selected by a user in the audio environment, at least in part, by applying an exponentially weighed smoothing filter to the plurality of audio output gain settings;
apply the calculated audio output gain setting to an audio output;
as a user changes position with respect to the IHS, monitor a distance between the user and the IHS;
modify the calculated audio output gain setting based upon the monitoring, wherein the modification causes a constant sound pressure level to be maintained at the user's position; and
apply the modified audio output gain setting to the audio output.

6. The hardware memory device of claim 5, wherein the audio environment is selected from the group consisting of: quiet, noisy, mechanical noise, speech, music, motion, and engine.

7. The hardware memory device of claim 5, wherein the program instructions, upon execution, further cause the IHS to identify an ongoing IHS operation selected from the group consisting of: video playback, music playback, or call.

8. The hardware memory device of claim 7, wherein the ongoing IHS operation is the call, and wherein the program instructions, upon execution, further cause the IHS to:
adjust an audio input gain setting based upon the classification; and
modify the adjusted audio input gain setting based upon the monitoring, wherein the modification compensates for the distance.

9. A method, comprising:
classifying an audio environment of an Information Handling System (IHS);
adjusting an audio output gain setting based upon the classification;
calculating an audio output gain setting based upon a running average of a plurality of audio output gain settings previously selected by a user in the audio environment, at least in part, by applying an exponentially weighed smoothing filter to the plurality of audio output gain settings;
applying the calculated audio output gain setting to an audio output;
as a user changes position with respect to the IHS, monitoring a distance between the user and the IHS;
modifying the calculated audio output gain setting based upon the monitoring, wherein the modification causes a constant sound pressure level to be maintained at the user's position; and
applying the modified audio output gain setting to the audio output.

10. The method of claim 9, wherein the audio environment is selected from the group consisting of: quiet, noisy, mechanical noise, speech, music, motion, and engine.

11. The method of claim 9, further comprising:
adjusting an audio input gain setting based upon the classification; and
modifying the adjusted audio input gain setting based upon the monitoring, wherein the modification compensates for the distance.

* * * * *